United States Patent
Koshiyama et al.

(10) Patent No.: US 7,884,062 B2
(45) Date of Patent: Feb. 8, 2011

(54) CLEANING LIQUID FOR LITHOGRAPHY AND CLEANING METHOD USING SAME

(75) Inventors: Jun Koshiyama, Kawasaki (JP); Hideya Kobari, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 167 days.

(21) Appl. No.: 12/224,300

(22) PCT Filed: Feb. 14, 2007

(86) PCT No.: PCT/JP2007/052624

§ 371 (c)(1),
(2), (4) Date: Aug. 22, 2008

(87) PCT Pub. No.: WO2007/097233

PCT Pub. Date: Aug. 30, 2007

(65) Prior Publication Data

US 2009/0029893 A1    Jan. 29, 2009

(30) Foreign Application Priority Data

Feb. 23, 2006  (JP) .............................. 2006-047002
Mar. 24, 2006  (JP) .............................. 2006-082093

(51) Int. Cl.
*C11D 7/50*  (2006.01)
(52) U.S. Cl. ........................ 510/175; 510/176; 134/1.3
(58) Field of Classification Search ................. 510/175, 510/176; 134/1.3
See application file for complete search history.

(56) References Cited

U.S. PATENT DOCUMENTS

| 4,983,490 | A | | 1/1991 | Durham |
|---|---|---|---|---|
| 5,612,303 | A | * | 3/1997 | Takayanagi et al. ......... 510/174 |
| 5,849,467 | A | | 12/1998 | Sato et al. |
| 6,117,623 | A | | 9/2000 | Koshiyama et al. |
| 6,250,317 | B1 | * | 6/2001 | Nakayama .................... 134/38 |
| 7,335,319 | B2 | * | 2/2008 | Peterson et al. ............. 252/364 |
| 2001/0038976 | A1 | * | 11/2001 | Tanabe et al. ............... 430/325 |
| 2003/0030030 | A1 | * | 2/2003 | Sahbari ..................... 252/79.1 |
| 2003/0113673 | A1 | | 6/2003 | Ahn et al. |
| 2003/0171240 | A1 | * | 9/2003 | Hanada et al. .............. 510/407 |
| 2003/0227005 | A1 | | 12/2003 | Peterson et al. |
| 2007/0161530 | A1 | * | 7/2007 | Kaneda et al. .............. 510/176 |
| 2007/0177869 | A1 | | 8/2007 | Yamamoto et al. |
| 2008/0161217 | A1 | * | 7/2008 | Zhang et al. ................ 510/176 |

FOREIGN PATENT DOCUMENTS

JP    04-042523    2/1992

(Continued)

*Primary Examiner*—Gregory E Webb
(74) *Attorney, Agent, or Firm*—Wenderoth, Lind & Ponack, L.L.P.

(57) ABSTRACT

Disclosed is a cleaning liquid for lithography which is characterized by containing a mixed organic solvent which is obtained by mixing (A) at least one solvent selected from ketone organic solvents and glycol ether organic solvents, (B) at least one solvent selected from lactone organic solvents and (C) at least one solvent selected from alkoxy benzenes and aromatic alcohols. This cleaning liquid is highly safe and does not have adverse effects on the environment or the human body, while having basic characteristics necessary for a cleaning liquid for lithography. In addition, this cleaning liquid can be stably supplied at low cost.

12 Claims, 2 Drawing Sheets

FOREIGN PATENT DOCUMENTS

| | | |
|---|---|---|
| JP | 04-130715 | 5/1992 |
| JP | 4-49938 | 8/1992 |
| JP | 5-75110 | 10/1993 |
| JP | 09-269601 | 10/1997 |
| JP | 11-218933 | 8/1999 |
| JP | 2000-171987 | 6/2000 |
| JP | 2003-114538 | 4/2003 |
| JP | 2003-195529 | 7/2003 |
| JP | 2003-248328 | 9/2003 |
| JP | 2005-524972 | 8/2005 |
| JP | 2005-286208 | 10/2005 |
| JP | 2005-294520 | 10/2005 |

* cited by examiner

CLEANING LIQUID FOR LITHOGRAPHY AND CLEANING METHOD USING SAME

TECHNICAL FIELD

The present invention relates to a cleaning solution for use in manufacturing a resist pattern by lithography or, particularly, to a cleaning solution for lithography suitably used in manufacturing process for a resist pattern by immersion lithography.

BACKGROUND TECHNOLOGY

A semiconductor device is known to be manufactured through a step of forming a photoresist pattern on a base material by lithography. Recently, to satisfy the requirement for further reducing the dimensions of a semiconductor device, immersion lithography has been proposed. In this technology, during a light exposure step, a liquid immersion medium of a predetermined thickness is placed on an optical path between the film to be exposed to light formed on a substrate and a light-exposure device (lens), at least on the film, and light is applied to the film to form a resist pattern. In this manner, the space of the optical path of exposure light is filled with a liquid immersion medium having a refractive index (n), which is greater than that of the air or inert gas and smaller than that of a resist film, in place of the air or inert gas such as nitrogen used in a conventional method. By virtue of this, high resolution can be obtained similarly to the case where a shorter-wavelength light is used or the case where a high NA lens is used, even if the wavelength of the light source for exposure be unchanged. In addition, there is another advantage in that focal depth latitude is not decreased. Accordingly, if immersion lithography mentioned above is used, a resist pattern increased in resolution and improved in depth of focus can be formed by using the lens attached to a light exposure apparatus so far employed and by incurring no extra development cost for especially manufacturing a high-resolution lens for micro-fabrication. Because of this, immersion lithography has attracted great attention.

In addition, in either one of conventional lithography and immersion lithography, a resist pattern is formed by using a resist film selected so as to correspond to the wavelength of exposure light such as g-line light, i-line light, KrF excimer laser, ArF excimer laser or EUV; an anti-reflective film provided as a lower layer of the resist film; and a protective film formed as an upper layer of the resist film. However, when these films are formed, a photosensitive resist-film forming coating solution adheres to a back surface portion of a substrate and an edge portion thereof, staining the substrate. The solution unnecessarily adhered to the portions must be cleaned and removed prior to performing the next process step.

In lithography, when the photosensitive resist film thus formed is exposed to light for pattern formation and developed to form a resist pattern, it is necessary to clean and remove resist remaining uncured. Furthermore, since the resist pattern thus formed is no longer needed after a semiconductor device is manufactured by etching, the whole resist present on the substrate must be cleaned and removed.

As is described above, in lithography, a cleaning operation must be performed several times for removing a resist coating film.

In lithography, besides these cleaning operations, a cleaning operation is performed for cleaning the surface of a substrate before a coating film is formed thereon. Furthermore, a cleaning operation is performed for removing stain adhered to a machine for supplying a base material with materials for forming various types of coating films, such as a resist film, an anti-reflective film and a protective film, optionally for preventing stain from affecting a series of steps for forming a resist pattern.

To carry out various types of cleaning operations, cleaning solutions suitable for individual purposes are required. However, the number of supply pipes for cleaning solutions for lithography to be provided to a semiconductor manufacturing line is limited. For the reason, a universal cleaning solution, which is applicable, as commonly as possible, to materials for forming various types of coating films and objects to be removed for different purposes, is required.

Additionally, the cleaning solution for lithography must satisfy basic cleaning properties such as ability to dissolve and remove an unnecessary part effectively in a short time, ability to get dry quickly in a short time, and ability not to affect the shape of the resist film purposely left for use in the step to follow. In addition, the cleaning solution must satisfy requirement to produce no harmful effect on the environment and human body, ensure safety and be available at low cost.

To satisfy these requirements, the following cleaning solutions for lithography have been proposed. Examples thereof include cleaning solutions for lithography consisting of a single component, such as a cleaning solution consisting of a solvent based on ethyleneglycol or an ester thereof (JP5-75110B), a cleaning solution consisting of propyleneglycol alkyl ether acetate (JP4-49938B), a cleaning solution consisting of alkyl 3-alkoxypropionate (JP4-42523A) and a cleaning solution consisting of alkyl pyruvate (JP4-130715A); and cleaning solutions for lithography using a mixture of two kinds or more of solvents, such as a cleaning solution using a mixture of propyleneglycol alkyl ether, monoketone having 1 to 7 carbon atoms and lactam or lactone (JP11-218933A), a cleaning solution for lithography containing n-types of solvents satisfying $9 \leq \Sigma x_i \delta_i \leq 12$, wherein $x_i$ is defined as a weight proportion of a component i and $\delta_i$ is defined as a solubility parameter calculated with a Fedors method (JP2003-114538A), and a cleaning solution using a mixture of acetic ester, γ-butyrolactone and a non-acetic ester (JP2003-195529A).

However, some of these cleaning solutions for lithography are lack of basic cleaning capability or dryability. Others which satisfy these requirements, only have a good cleaning effect on a specific coating film and no sufficient cleaning effect on other coating films. Still others have drawbacks in that the yield of a product decreases and that the effect of removing unnecessary resist varies depending on the portion where it adhered. In short, these cleaning solutions do not satisfy either one of basic properties and requisite properties as a cleaning solution for lithography and are not always satisfactory in view of practical use.

DISCLOSURE OF THE INVENTION

The present invention was attained under these circumstances. An object of the present invention is to provide a cleaning solution for lithography, which is available at low cost, made of safe components; universally and commonly applicable to removing an unnecessary part no matter what type of coating film is used and no matter which portion the coating film is adhered, in addition, which is capable of dissolving and removing an unnecessary part and stain effectively in a short time and quickly; and producing no adverse effect against the necessary part to be left. In particular, an object of the present invention is to provide a cleaning solution for lithography capable of excellently removing resist from an unnecessary part no matter where resist is adhered.

The present inventors have conducted various studies on a cleaning solution for lithography. As a result, they have found that aforementioned objects can be achieved by using an organic solvent mixture containing three types of organic solvents individually selected from mutually different specific groups. Based on the finding, they have accomplished the present invention.

More specifically, according to the present invention, there are provided a cleaning solution for lithography characterized by containing an organic solvent mixture which is a combination consisting of (A) at least one kind of solvent selected from ketone organic solvents and glycol ether organic solvents, (B) at least one kind of solvent selected from lactone organic solvents and (C) at least one kind of solvent selected from alkoxybenzenes and aromatic alcohols; a method for cleaning a base material characterized by cleaning the base material by using the aforementioned cleaning solution for lithography in a cleaning step in manufacturing a base material by immersion lithography; and a method for cleaning a chemical supplying machine characterized by performing cleaning of the chemical supplying machine for forming a coating film by using the aforementioned cleaning solution for lithography in manufacturing a base material by immersion lithography.

The cleaning solution for lithography of the present invention is characterized by containing an organic solvent mixture which is a combination of three kinds of solvents as the essential ingredients, consisting of (A) at least one kind of solvent selected from ketone organic solvents and glycol ether organic solvents, (B) at least one kind of solvent selected from lactone organic solvents, and (C) at least one kind of solvent selected from alkoxybenzenes and aromatic alcohols.

The content rates of the components (A), (B) and (C) in the organic solvent mixture are selected in the range of from 3 to 60% by mass; in the range of from 3 to 60% by mass; and in the range of from 20 to 90% by mass, respectively.

As the component (A), a ketone organic solvent or a glycol ether organic solvent is used. Examples of the ketone organic solvent include acetone, methyl ethyl ketone, diethyl ketone, methyl isopropyl ketone, methyl isobutyl ketone, cyclopentanone and cyclohexanone. Of them, what are particularly preferable are methyl ethyl ketone and cyclohexanone. Examples of the glycol ether organic solvent include alkyleneglycol alkyl ethers. As the alkyleneglycol moiety, a straight or branched glycol having 2 to 4 carbon atoms is preferable, which includes ethyleneglycol, propyleneglycol and butyleneglycol. As the alkyl group, a straight or branched alkyl group having 1 to 6 carbon atoms is preferable, which includes a methyl group, an ethyl group, a propyl group, an isopropyl group, a butyl group, a sec-butyl group, a t-butyl group, various pentyl groups and various hexyl groups. The alkyl group may be a cycloalkyl group such as a cyclohexyl group. What is particularly preferable is propyleneglycol monomethyl ether.

The component (A) can be used singly or can be used as a mixture of two kinds or more.

The content of the component (A) is selected in the range of from 3 to 60% by mass or, particularly preferably, from 5 to 50% by mass relative to the total amount of the components (A), (B) and (C). When a ketone organic solvent is employed as the component (A), the content is preferably from 5 to 42% by mass. By employing the contents mentioned above, a cleaning solution having not only excellent cleaning capability but also excellent dryability can be obtained no matter which type of cleaning object is used and no matter which cleaning step is employed.

As the lactone organic solvent serving as the component (B), a lactone derived from hydroxycarboxylic acid having 4 to 6 carbon atoms and constituting a 5-membered or 6-membered ring may be used which includes γ-butyrolactone, γ-valerolactone, δ-valerolactone, γ-caprolactone and δ-caprolactone. In particular, γ-butyrolactone is preferable since it can provide a cleaning solution having flexibility and excellent cleaning capability.

The content of the component (B) is selected in the range of from 3 to 60% by mass or, particularly preferably, from 5 to 42% by mass relative to the total amount of the components (A), (B) and (C). When a glycol organic solvent is used as the component (A), from 3 to 40% by mass or, particularly, from 5 to 35% by mass is preferable. By employing the contents mentioned above, a cleaning solution having excellent cleaning capability can be provided regardless of a cleaning purpose and an object to be removed.

Next, as the component (C), an alkoxybenzene or an aromatic alcohol may be used.

As the alkoxy group of the alkoxybenzene, mention may be made of a saturated or unsaturated alkoxy group having 1 to 4 carbon atoms, such as a methoxy group, an ethoxy group, a propoxy group and a vinyloxy group. Two or more alkoxy groups may be present. The benzene ring of the alkoxybenzene may be further substituted with one or two or more saturated or unsaturated alkyl groups such as a methyl group, an ethyl group, a propyl group, a vinyl group, a propenyl group and a hydroxyl group. Preferable examples of the alkoxybenzene include anisole, phenetole, phenoxyethylene, methoxytoluene, pyrocatechol monomethyl ether, pyrocatechol dimethyl ether, m-methoxyphenol, m-dimethoxybenzene, p-dimethoxybenzene, vinylanisole, p-(1-propenyl)anisole and p-allylanisole.

On the other hand, as the aromatic alcohol, mention may be made of an aromatic alcohol composed of a benzene ring and one or two or more hydroxyalkyl groups with 1 to 3 carbon atoms, such as benzyl alcohol, phenethyl alcohol, 1-phenylethanol, 1-phenyl-1-propanol or xylene-α,α'-diol; an aromatic alcohol as mentioned above, whose benzene ring is further substituted with a substituent such as a saturated or unsaturated alkyl group or alkoxy group having 1 to 4 carbon atoms, a hydroxyl group, an amino group, a carboxyl group, such as methylbenzyl alcohol, p-isopropylbenzyl alcohol, cinnamyl alcohol, salicyl alcohol, p-hydroxybenzyl alcohol, anisyl alcohol or aminobenzyl alcohol. Of them, alkoxybenzenes or, in particular, anisole is preferable since it is easily handled and provides a cleaning solution excellent in cleaning capability.

These serving as the component (C) can be used singly or can be used as a combination of two kinds or more.

The content of the component (C) is selected in the range of from 20 to 90% by mass or, preferably, from 25 to 60% by mass relative to the total amount of the components (A), (B) and (C). When a glycol ether organic solvent is used as the component (A), from 20 to 80% by mass or, particularly, from 30 to 60% by mass is preferable. By employing the contents mentioned above, a cleaning solution having excellent cleaning capability and dryability can be provided regardless of an object to be removed and no matter how the solution is used.

The cleaning solution for lithography of the present invention is suitably used in a cleaning step for a base material and a cleaning step for a chemical solution supplying machine when a semiconductor device is manufactured by lithography or, in particular, immersion lithography.

This method will be described below.

The step of cleaning a base material using the cleaning solution for lithography include (1) step of removing an unnecessary part of a coating film adhered to either of a back surface portion or an edge portion of a substrate or both of them after the coating film is formed on the base material; (2) step of removing an entire coating film present on a base material after the coating film is formed on a base material; and (3) step of cleaning a base material before a coating solution for forming a coating film is applied.

These steps can be performed as follows.

(1) To form a coating film such as a resist, an anti-reflective film or a protective film on a base material, a coating solution is usually applied by spin coating. In this case, since the coating solution diffuses in a radiation direction by centrifugal force, the film thickness of the edge portion of the base material is thicker than that of the center portion. In addition, the solution goes to the back surface of the base material and adheres thereto. Therefore, it is necessary to remove unnecessary coating film from a thicker part of the edge portion and unnecessary coating film adhered to the back surface.

In such cases, the cleaning solution for lithography of the present invention is used and kept in contact with these unnecessary parts of the coating film to remove them.

To explain more specifically, in conventional lithography, a coating film, in the removal treatment, must have a rectangular-form edge portion so as not to produce an adverse effect on the step to follow. Therefore, it is difficult to keep the cleaning solution for lithography of the present invention in contact with an unnecessary part to clean and remove. However, when local immersion exposure is conducted in immersion lithography, it is advantageous to use the cleaning solution for lithography of the present invention since a favorable cross sectional shape shown in FIG. 1 or 2 can be formed by keeping an edge portion in contact with the cleaning solution. In these figures, reference numerals 1, 2, 3 and 4 denote a silicon wafer, an anti-reflective film, a resist film and a resist protective film, respectively. A means for keeping the cleaning solution for lithography of the present invention in contact with an unnecessary part is not particularly limited and can be selected from those known in the art may be used.

As an example of the means, there is a method of dropping a cleaning solution or spraying it through a cleaning solution supply nozzle onto the edge portion or back portion of a base material under rotation. In this method, a supply amount of cleaning solution through the nozzle is not always constant depending on the type of resist to be used and film thickness but usually selected in the range of 3 to 50 ml/min. Besides this, there is a method of immersing a base material in a cleaning solution for a specified length of time by inserting the edge portion of the base material in a horizontal direction into a reservoir vessel filled with the cleaning solution beforehand.

(2) The cleaning solution for lithography of the present invention can be also used for removing the entire coating film formed on a base material.

To explain more specifically, the coating film formed on a base material is heated and dried to be cured. At this time, when the coating film has a defect, the coating treatment is started from the beginning, in other words, rework treatment is performed, in some cases. In this case, the entire coating film formed on the base material can be removed by keeping the cleaning solution for lithography of the present invention in contact with the film. A means to be employed in rework treatment is not particularly limited and can be selected from those known in the art may be used.

(3) The cleaning solution for lithography of the present invention can be used also in a so-called step of a pre-wet treatment step, i.e. a step for cleaning the surface of a base material before a coating solution is applied. In the pre-wet treatment, a cleaning solution is applied dropwise onto a base material. A means for applying the solution dropwise is not particularly limited and can be selected from those known in the art may be used. The pre-wet treatment is effective for reducing the amount of resist to be used in forming a resist coating film.

(4) The cleaning solution for lithography of the present invention is useful also for cleaning a supplying machine for various types of raw-material chemicals, which are each used in forming a coating film on a base material.

The chemical supplying machine to be used for forming various types of coating films on a base material is mainly constituted of members such as a pipe(s), a chemical-solution coating nozzle and a coater cup. When an operation is stopped, each of various types of chemical solutions adheres to the inner portions of the members and solidifies, preventing the next operation. Alternatively, when the chemical solution to be used is exchanged, it may be contaminated with the remaining chemical solution. To avoid such a trouble, the remaining chemical solution must be cleaned and removed. As the cleaning solution for use in this case, the cleaning solution for lithography of the present invention is also suitable.

For example, a pipe of the chemical supplying machine is cleaned by using the cleaning solution for lithography of the present invention as follows. The chemical solution within the pipe is all discharged. Thereafter, the pipe is filled with the cleaning solution for lithography injected and allowed to stand still for a while. After the stain adhered to the inner portion is completely dissolved, the cleaning solution for lithography is allowed to discharge from the pipe. During or after the discharge of the solution, another chemical solution for forming a coating film is supplied into the pipe. In this manner, supply of a chemical solution onto the base material is restarted.

The cleaning solution for lithography of the present invention has an excellent compatibility to various types of coating film forming materials but no reactivity with them. Therefore, even if the solution is in contact with these materials, neither heat nor gas is generated. As a result, excellent cleaning effect is obtained with no foreign matter separated and no white turbidity of the liquid in the pipe.

In addition, even if residues of a chemical solution are fixed onto the inner portion of the pipe when an operation is performed for a long time, the residues are easily dissolved in the cleaning solution for lithography of the present invention and removed. Therefore, generation of particles can be completely prevented.

Next, a chemical solution coating nozzle is cleaned by using the cleaning solution for lithography of the present invention as follows. A portion to which a coating solution for forming a coating film is adhered is kept in contact with the cleaning solution for lithography by using a conventional means to clean and remove the adhering coating solution. In the case where the coating nozzle is allowed to remain unused for long time, usually the tip of the nozzle is placed in a state of dispense in a solvent atmosphere. The cleaning solution for lithography of the present invention can be used as the dispense solution.

Furthermore, a coater cup is cleaned by using the cleaning solution for lithography of the present invention as follows. For example, the cleaning solution for lithography of the present invention is kept in contact with residual coating film adhered to the coater cup, which is provided within a chemical supplying machine. In this manner, the residual coating film is dissolved and removed.

Examples of the coating film to be removed by the cleaning solution for lithography of the present invention include a resist film selected so as to correspond to the wavelength of each exposure light such as g-line light, i-line light, KrF excimer laser, ArF excimer laser or EUV, an anti-reflective film provided as a lower layer of the resist film, and a protective film provided as an upper layer of the resist film. As materials for the coating films, any known materials can be used. In particular, in immersion lithography, one and the same cleaning solution for lithography of the present invention can be applied to all materials for an anti-reflective film, a resist film and a protective film, which are successively layered on a substrate. Therefore, the cleaning solution for lithography of the present invention is advantageous.

As a material for forming the aforementioned resist films, materials containing a novolak resin, a styrene resin, an acrylic resin or a silicon-atom containing resin as a base material resin component are usually used. As a material for forming the anti-reflective film to be provided as a lower layer of each of the resist films, materials containing an acrylic resin having a light absorbing substituent are usually used. As a material for forming the protective film to be provided as an upper layer of each of the resist films, materials containing an alkali soluble resin composed of a fluorine-atom containing polymer are usually used. The cleaning solution for lithography of the present invention is effective to each of these materials.

Generally in a cleaning step, there is required cleaning capability such that a target substance to be cleaned can be removed by cleaning efficiently in a short time. The time required for cleaning treatment varies depending on individual cleaning steps. However, cleaning must be performed usually for 1 to 60 seconds.

As dryability, drying performance in a short time is required and it is usually for 5 to 60 seconds.

Furthermore, the cleaning solution for lithography is required to have a basic property of producing no adverse effect on the shape of the residual film that is to be used in the step to follow.

The cleaning solution for lithography of the present invention satisfies all of these requirements.

BEST MODE FOR CARRYING OUT THE INVENTION

Figure 1:
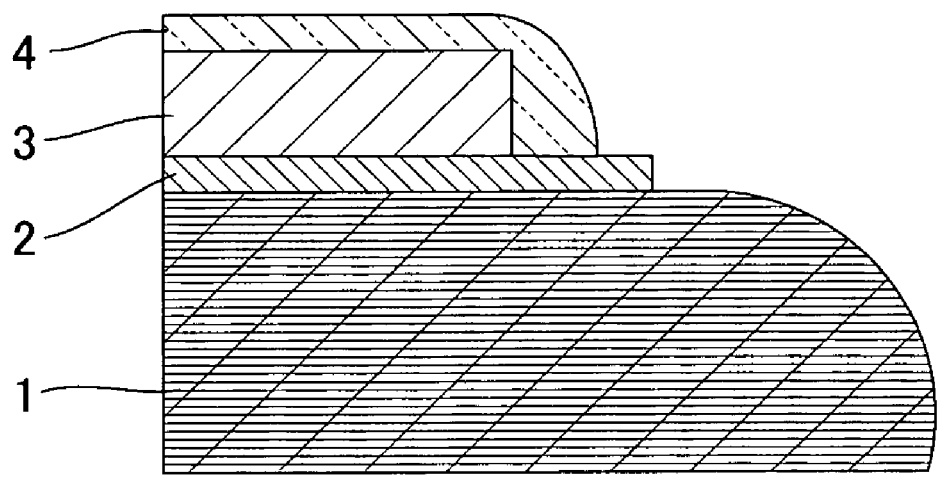
FIG. 1 is a schematic view showing an example of a stack structure of coating films in immersion lithography.

Best mode for carrying out the invention will be described by way of examples; however, the present invention is not particularly limited to these.

Note that the evaluation criteria indicated in each Table are as follows.

[Cup Cleaning Capability]

A: Stain adhered to the inner portion of a cup was removed.

D: Stain adhered to the inner portion of a cup was not removed.

[Edge Cleaning Capability]

A: Cleaning capability of a coating film was good.

B: A coating film was able to be cleaned and removed but irregularity was noted.

[Residues on the Upper Surface of Edge (Residues on Edge)]

A: No residue was observed.

B: Residues were observed.

[Residues on the Bevel of Edge (Residues on Edge-Bevel)]

A: No residue was observed.

B: Residues were observed.

C: Dry spot was observed since a cleaning agent was not completely dried.

D: Coating film itself was not removed.

Reference symbols in each Table indicate as follows.

GBL: γ-butyrolactone

ANS: anisole

CH: cyclohexanone

MEK: methyl ethyl ketone

PGME: propyleneglycol monomethyl ether

PGMEA: propyleneglycol monomethyl ether acetate

Example 1

Comparative Example 1

A 300-mm silicon wafer was coated with a resist for i-line light (a product by TOKYO OHKA KOGYO CO., LTD., a product name "TDMR-AR3000") containing novolac resin as a base material resin to form a resist film. Thus formed base material was subjected to cup cleaning and substrate edge or edge cleaning by using cleaning solutions for lithography represented by Nos. 1 to 10 and having the compositions shown in Table 1. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 1.

TABLE 1

| Example | Sample No. | Ingredient, % by mass | | | | Properties | | | |
|---|---|---|---|---|---|---|---|---|---|
| | | GBL | ANS | CH | MEK | Cup cleaning capability | Edge cleaning capability | Residues on edge | Residues on edge-bevel |
| Example 1 | 1 | 40 | 50 | — | 10 | A | A | A | A |
| | 2 | 30 | 50 | — | 20 | A | A | A | A |
| | 3 | 5 | 90 | — | 5 | A | A | A | A |
| | 4 | 5 | 50 | 40 | 5 | A | A | A | A |
| | 5 | 10 | 40 | 40 | 10 | A | A | A | A |
| | 6 | 20 | 30 | 30 | 20 | A | A | A | A |
| | 7 | 20 | 40 | 40 | — | A | A | A | A |
| Comparative Example 1 | 8 | 50 | 50 | — | — | A | B | A | B |
| | 9 | 70 | — | — | 30 | A | B | A | C |
| | 10 | — | 70 | — | 30 | D | A | A | D |

Example 2

Comparative Example 2

A 300-mm silicon wafer was coated with a resist for KrF excimer laser (a product by TOKYO OHKA KOGYO CO., LTD., a product name "TDUR-P015") containing polyhydroxystyrene as a base material resin to form a resist film. Thus formed base material was subjected to cup cleaning and substrate edge or edge cleaning by using cleaning solutions for lithography represented by Nos. 1 to 10 and having the compositions shown in Table 2. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 2.

Example 3

Comparative Example 3

A 300-mm silicon wafer was coated with a resist for ArF excimer laser (a product by TOKYO OHKA KOGYO CO., LTD., a product name "TARF-P6111") containing acrylic resin as a base material resin to form a resist film. Thus formed base material was subjected to cup cleaning and substrate edge or edge cleaning by using cleaning solutions for lithography represented by Nos. 1 to 10 and having the compositions shown in Table 3. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 3.

TABLE 2

| Example | Sample No. | Ingredient, % by mass | | | | Properties | | | |
|---|---|---|---|---|---|---|---|---|---|
| | | GBL | ANS | CH | MEK | Cup cleaning capability | Edge cleaning capability | Residues on edge | Residues on edge-bevel |
| Example 2 | 1 | 40 | 50 | — | 10 | A | A | A | A |
| | 2 | 30 | 50 | — | 20 | A | A | A | A |
| | 3 | 5 | 90 | — | 5 | A | A | A | A |
| | 4 | 5 | 50 | 40 | 5 | A | A | A | A |
| | 5 | 10 | 40 | 40 | 10 | A | A | A | A |
| | 6 | 20 | 30 | 30 | 20 | A | A | A | A |
| | 7 | 20 | 40 | 40 | — | A | A | A | A |
| Comparative Example 2 | 8 | 50 | 50 | — | — | A | A | A | C |
| | 9 | 70 | — | — | 30 | A | B | A | C |
| | 10 | — | 70 | — | 30 | A | B | A | D |

TABLE 3

| Example | Sample No. | Ingredient, % by mass | | | | Properties | | | |
| --- | --- | --- | --- | --- | --- | --- | --- | --- | --- |
| | | GBL | ANS | CH | MEK | Cup cleaning capability | Edge cleaning capability | Residues on edge | Residues on edge-bevel |
| Example 3 | 1 | 40 | 50 | — | 10 | A | A | A | A |
| | 2 | 30 | 50 | — | 20 | A | A | A | A |
| | 3 | 5 | 90 | — | 5 | A | A | A | A |
| | 4 | 5 | 50 | 40 | 5 | A | A | A | A |
| | 5 | 10 | 40 | 40 | 10 | A | A | A | A |
| | 6 | 20 | 30 | 30 | 20 | A | A | A | A |
| | 7 | 20 | 40 | 40 | — | A | A | A | A |
| Comparative Example 3 | 8 | 50 | 50 | — | — | A | B | A | C |
| | 9 | 70 | — | — | 30 | A | B | A | C |
| | 10 | — | 70 | — | 30 | A | B | A | B |

Example 4

Comparative Example 4

A 300-mm silicon wafer was coated with a Si containing resist (a product by TOKYO OHKA KOGYO CO., LTD., a product name "TARF-SC127") containing silicon-atom containing polymer as a base material resin to form a resist film. Thus formed base material was subjected to cup cleaning and substrate edge or edge cleaning by using cleaning solutions for lithography represented by Nos. 1 to 10 and having the compositions shown in Table 4. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 4.

Example 5

Comparative Example 5

A 300-mm silicon wafer was coated with an anti-reflective film forming material (a product by Brewer Science, Inc., a product name "ARC29A") containing acrylic polymer as a base material resin to form an anti-reflective film. Thus formed base material was subjected to cup cleaning and substrate edge or edge cleaning by using cleaning solutions for lithography represented by Nos. 1 to 10 and having the compositions shown in Table 5. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 5.

TABLE 4

| Example | Sample No. | Ingredient, % by mass | | | | Properties | | | |
| --- | --- | --- | --- | --- | --- | --- | --- | --- | --- |
| | | GBL | ANS | CH | MEK | Cup cleaning capability | Edge cleaning capability | Residues on edge | Residues on edge-bevel |
| Example 4 | 1 | 40 | 50 | — | 10 | A | A | A | A |
| | 2 | 30 | 50 | — | 20 | A | A | A | A |
| | 3 | 5 | 90 | — | 5 | A | A | A | A |
| | 4 | 5 | 50 | 40 | 5 | A | A | A | A |
| | 5 | 10 | 40 | 40 | 10 | A | A | A | A |
| | 6 | 20 | 30 | 30 | 20 | A | A | A | A |
| | 7 | 20 | 40 | 40 | — | A | A | A | A |
| Comparative Example 4 | 8 | 50 | 50 | — | — | A | B | B | C |
| | 9 | 70 | — | — | 30 | A | A | B | C |
| | 10 | — | 70 | — | 30 | D | B | B | B |

TABLE 5

| Example | Sample No. | Ingredient, % by mass | | | | Cup cleaning capability | Edge cleaning capability | Residues on edge | Residues on edge-bevel |
|---|---|---|---|---|---|---|---|---|---|
| | | GBL | ANS | CH | MEK | | | | |
| Example 5 | 1 | 40 | 50 | — | 10 | A | A | A | A |
| | 2 | 30 | 50 | — | 20 | A | A | A | A |
| | 3 | 5 | 90 | — | 5 | A | A | A | A |
| | 4 | 5 | 50 | 40 | 5 | A | A | A | A |
| | 5 | 10 | 40 | 40 | 10 | A | A | A | A |
| | 6 | 20 | 30 | 30 | 20 | A | A | A | A |
| | 7 | 20 | 40 | 40 | — | A | A | A | A |
| Comparative Example 5 | 8 | 50 | 50 | — | — | A | B | B | C |
| | 9 | 70 | — | — | 30 | A | B | A | C |
| | 10 | — | 70 | — | 30 | A | B | A | D |

Example 6

Comparative Example 6

A 300-mm silicon wafer was coated with a protective film forming material (a product by TOKYO OHKA KOGYO CO., LTD., a product name "TILC-031") containing a fluorine-atom containing alkali-soluble polymer as a base material resin to form a protective film. Thus formed base material was subjected to cup cleaning and substrate edge or edge cleaning by using cleaning solutions for lithography represented by Nos. 1 to 10 and having the compositions shown in Table 6. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 6.

From the results of Examples 1 to 6 and Comparative Examples 1 to 6, it is found that a cleaning solution having flexibility and excellent cleaning capability but without adverse effect on the steps to follow can be obtained by employing a composition of the cleaning solution according to the present invention.

Examples 7 and Comparative Example 7

A 300-mm silicon wafer was coated with an anti-reflective film forming material (a product by Brewer Science, Inc., a product name "ARC29A") and, subsequently, kept in contact with the same cleaning solution as sample No. 1 of Example 1 or sample No. 8 of Comparative Example 1 for 10 seconds to perform a cleaning treatment of the edge portion of the substrate. Thereafter, the substrate was subjected to a heat treatment at 215° C. for 60 seconds to form an anti-reflective film having a film thickness of 77 nm. A resist composition for ArF excimer laser (a product by TOKYO OHKA KOGYO

TABLE 6

| Example | Sample No. | Ingredient, % by mass | | | | Cup cleaning capability | Edge cleaning capability | Residues on edge | Residues on edge-bevel |
|---|---|---|---|---|---|---|---|---|---|
| | | GBL | ANS | CH | MEK | | | | |
| Example 1 | 1 | 40 | 50 | — | 10 | A | A | A | A |
| | 2 | 30 | 50 | — | 20 | A | A | A | A |
| | 3 | 5 | 90 | — | 5 | A | A | A | A |
| | 4 | 5 | 50 | 40 | 5 | A | A | A | A |
| | 5 | 10 | 40 | 40 | 10 | A | A | A | A |
| | 6 | 20 | 30 | 30 | 20 | A | A | A | A |
| | 7 | 20 | 40 | 40 | — | A | A | A | A |
| Comparative Example 1 | 8 | 50 | 50 | — | — | A | B | B | C |
| | 9 | 70 | — | — | 30 | A | B | A | C |
| | 10 | — | 70 | — | 30 | A | B | A | D |

Figure 2:
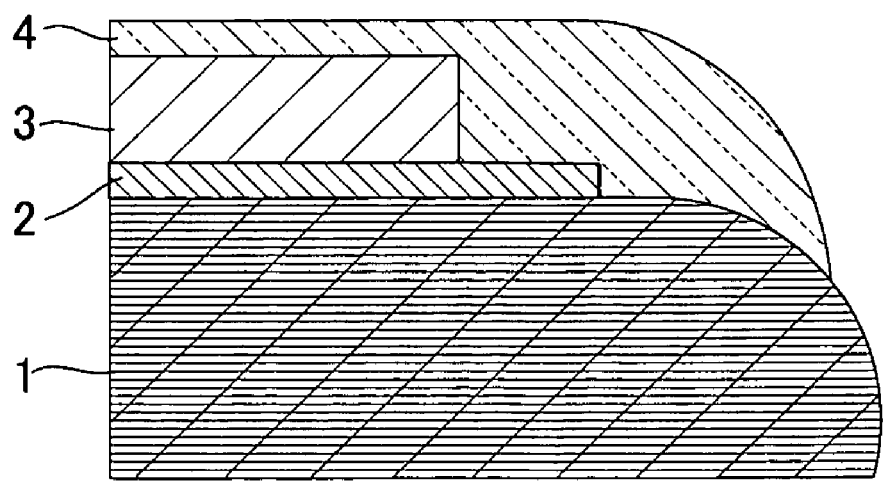
FIG. 2 is a schematic view showing another example which is different from that of FIG. 1 of a stack structure of coating films in immersion lithography.

CO., LTD., a product name "TARF-P6111") was applied onto the anti-reflective film and, subsequently, a cleaning treatment of the edge portion of the substrate was performed by keeping the edge in contact with the same cleaning solution as sample No. 1 of Example 1 or sample No. 8 of Comparative Example 1 for 10 seconds. Thereafter, the substrate was subjected to a heat treatment at 130° C. for 90 minutes to form a resist film having a film thickness of 215 nm. Furthermore, a protective film forming material (a product by TOKYO OHKA KOGYO CO., LTD., a product name "TILC-031") was applied onto the film and, subsequently, a cleaning treatment of the edge portion of the substrate was performed by keeping the edge in contact with the same cleaning solution as sample No. 1 of Example 1 or sample No. 8 of Comparative Example 1 for 10 seconds. Thereafter, the substrate was subjected to a heat treatment at 90° C. for 60 seconds to form a protective film having a film thickness of 35 nm. By such treatments, a base material having a stack structure shown in FIG. 2 was formed.

Figure 3:
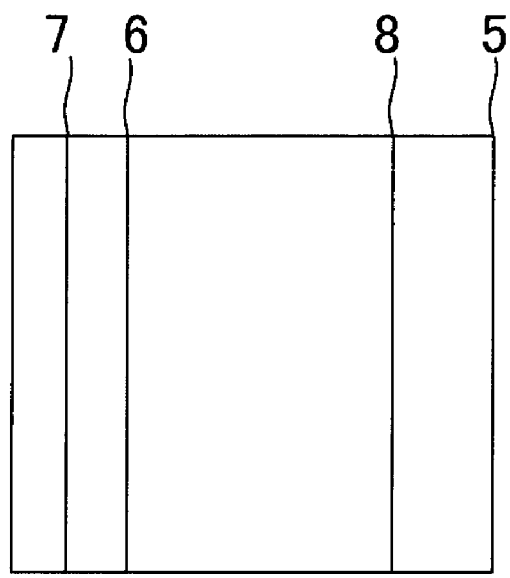
FIG. 3 is an illustration of a photograph showing the edge portion of a base material after cleaning treatment in Example 7 and taken from above in vertical direction.
Figure 4:
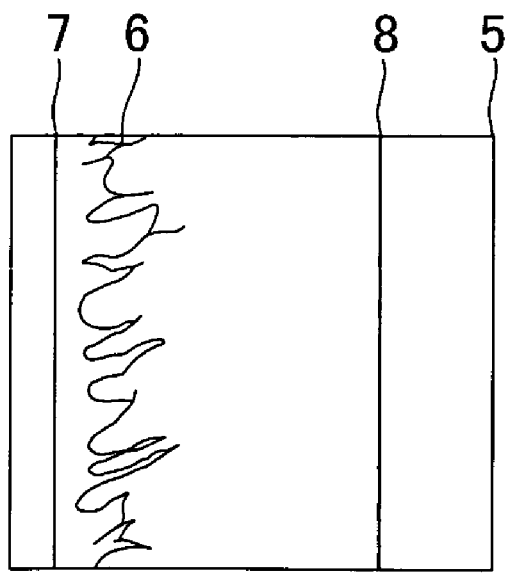
FIG. 4 is an illustration of a photograph showing the edge portion of a base material after cleaning treatment in Comparative Example 7 and taken from above in vertical direction.

With regard to the base materials thus treated, illustrations of the photographs of the edge portions of the substrates taken from above in vertical direction are shown in FIGS. 3 and 4. FIG. 3 is an illustration of a photograph of the edge portion of the substrate taken from above in vertical direction in the case of using sample No. 1 of Example 1 while FIG. 4 is an illustration of a photograph of the edge portion of the substrate taken from above in vertical direction in the case of using sample No. 8 of Comparative Example 1. In these figures, reference numerals 5, 6, 7 and 8 denote an edge portion of a silicon wafer, an anti-reflective film, a resist film, and a resist protective film, respectively.

As is apparent from the results of Example 7 and Comparative Example 7, good cleaning capability was obtained when a cleaning solution of the present invention was used. When a cleaning solution of the comparative example was used, the shape of the interface of an anti-reflective film was uneven and irregularity occurred even to the interface of a protective film.

Example 8

Comparative Example 8

A 300-mm silicon wafer was coated with a resist for i-line light (a product by TOKYO OHKA KOGYO CO., LTD., a product name "TDMR-AR3000") containing novolac resin as a base material resin to form a resist film. Thus formed base material was subjected to cup cleaning and substrate edge or edge cleaning by using cleaning solutions for lithography represented by Nos. 1 to 6 and having the compositions shown in Table 7. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 7.

TABLE 7

| | | | | | | Properties | | | |
|---|---|---|---|---|---|---|---|---|---|
| | Sample | Ingredient, % by mass | | | | Cup cleaning | Edge cleaning | Residues on | Residues on edge- |
| Example | No. | PGME | GBL | ANS | PGMEA | capability | capability | edge | bevel |
| Example 8 | 1 | 45 | 5 | 50 | — | A | A | A | A |
| | 2 | 30 | 20 | 50 | — | A | A | A | A |
| | 3 | 20 | 30 | 50 | — | A | A | A | A |
| Comparative Example 8 | 4 | — | 50 | 50 | — | A | B | A | B |
| | 5 | 30 | 70 | — | — | A | B | A | C |
| | 6 | 70 | — | — | 30 | A | A | A | A |

Example 9

Comparative Example 9

A 300-mm silicon wafer was coated with a resist for KrF excimer laser (a product by TOKYO OHKA KOGYO CO., LTD., a product name "TDUR-P015") containing polyhydroxystyrene as a base material resin to form a resist film. Thus formed base material was subjected to cup cleaning and substrate edge or edge cleaning by using cleaning solutions for lithography represented by Nos. 1 to 6 and having the compositions shown in Table 8. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 8.

TABLE 8

| Example | Sample No. | Ingredient, % by mass | | | | Properties | | | |
|---|---|---|---|---|---|---|---|---|---|
| | | PGME | GBL | ANS | PGMEA | Cup cleaning capability | Edge cleaning capability | Residues on edge | Residues on edge-bevel |
| Example 9 | 1 | 45 | 5 | 50 | — | A | A | A | A |
| | 2 | 30 | 20 | 50 | — | A | A | A | A |
| | 3 | 20 | 30 | 50 | — | A | A | A | A |
| Comparative Example 9 | 4 | — | 50 | 50 | — | A | A | A | C |
| | 5 | 30 | 70 | — | — | A | B | A | C |
| | 6 | 70 | — | — | 30 | A | B | A | A |

Example 10

Comparative Example 10

A 300-mm silicon wafer was coated with a resist for ArF excimer laser (a product by TOKYO OHKA KOGYO CO., LTD., a product name "TARF-P6111") containing acrylic resin as a base material resin to form a resist film. Thus formed base material was subjected to cup cleaning and substrate edge or edge cleaning by using cleaning solutions for lithography represented by Nos. 1 to 6 and having the compositions shown in Table 9. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 9.

Example 11

Comparative Example 11

A 300-mm silicon wafer was coated with a Si containing resist (a product by TOKYO OHKA KOGYO CO., LTD., a product name "TARF-SC127") containing silicon-atom containing polymer as a base material resin to form a resist film. Thus formed base material was subjected to cup cleaning and substrate edge or edge cleaning by using cleaning solutions for lithography represented by Nos. 1 to 6 and having the compositions shown in Table 10. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 10.

TABLE 9

| Example | Sample No. | Ingredient, % by mass | | | | Properties | | | |
|---|---|---|---|---|---|---|---|---|---|
| | | PGME | GBL | ANS | PGMEA | Cup cleaning capability | Edge cleaning capability | Residues on edge | Residues on edge-bevel |
| Example 10 | 1 | 45 | 5 | 50 | — | A | A | A | A |
| | 2 | 30 | 20 | 50 | — | A | A | A | A |
| | 3 | 20 | 30 | 50 | — | A | A | A | A |
| Comparative Example 10 | 4 | — | 50 | 50 | — | A | B | A | C |
| | 5 | 30 | 70 | — | — | A | B | A | C |
| | 6 | 70 | — | — | 30 | A | B | A | D |

TABLE 10

| Example | Sample No. | Ingredient, % by mass | | | | Properties | | | |
| --- | --- | --- | --- | --- | --- | --- | --- | --- | --- |
| | | PGME | GBL | ANS | PGMEA | Cup cleaning capability | Edge cleaning capability | Residues on edge | Residues on edge-bevel |
| Example 11 | 1 | 45 | 5 | 50 | — | A | A | A | A |
| | 2 | 30 | 20 | 50 | — | A | A | A | A |
| | 3 | 20 | 30 | 50 | — | A | A | A | A |
| Comparative Example 11 | 4 | — | 50 | 50 | — | A | B | B | C |
| | 5 | 30 | 70 | — | — | A | A | B | C |
| | 6 | 70 | — | — | 30 | D | B | B | D |

Example 12

Comparative Example 12

A 300-mm silicon wafer was coated with an anti-reflective film forming material (a product by Brewer Science, Inc., a product name "ARC29A") containing acrylic polymer as a base material resin to form an anti-reflective film. Thus formed base material was subjected to cup cleaning and substrate edge or edge cleaning by using cleaning solutions for lithography represented by Nos. 1 to 6 and having the compositions shown in Table 11. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 11.

Example 13

Comparative Example 13

A 300-mm silicon wafer was coated with a protective film forming material (a product by TOKYO OHKA KOGYO CO., LTD., a product name "TILC-031") containing a fluorine-atom containing alkali-soluble polymer as a base material resin to form a protective film. Thus formed base material was subjected to cup cleaning and substrate edge or edge cleaning by using cleaning solutions for lithography represented by Nos. 1 to 6 and having the compositions shown in Table 12. In the cup cleaning, cleaning treatment was performed by keeping the cup in contact with a cleaning solution for one minute. In the edge cleaning, cleaning treatment was performed by keeping the substrate edge in contact with a cleaning solution for 10 seconds. The results of the cup cleaning were visually inspected. The results of the edge cleaning after cleaning were observed by using a CCD camera (manufactured by Keyence Corporation) and evaluated for each of the cleaning capability, residues on the upper surface and residues on the bevel. The results are shown in Table 12.

TABLE 11

| Example | Sample No. | Ingredient, % by mass | | | | Properties | | | |
| --- | --- | --- | --- | --- | --- | --- | --- | --- | --- |
| | | PGME | GBL | ANS | PGMEA | Cup cleaning capability | Edge cleaning capability | Residues on edge | Residues on edge-bevel |
| Example 12 | 1 | 45 | 5 | 50 | — | A | A | A | A |
| | 2 | 30 | 20 | 50 | — | A | A | A | A |
| | 3 | 20 | 30 | 50 | — | A | A | A | A |
| Comparative Example 12 | 4 | — | 50 | 50 | — | A | B | B | C |
| | 5 | 30 | 70 | — | — | A | B | A | C |
| | 6 | 70 | — | — | 30 | A | D | A | D |

TABLE 12

| Example | Sample No. | Ingredient, % by mass | | | | Properties | | | |
|---|---|---|---|---|---|---|---|---|---|
| | | PGME | GBL | ANS | PGMEA | Cup cleaning capability | Edge cleaning capability | Residues on edge | Residues on edge-bevel |
| Example 13 | 1 | 45 | 5 | 50 | — | A | A | A | A |
| | 2 | 30 | 20 | 50 | — | A | A | A | A |
| | 3 | 20 | 30 | 50 | — | A | A | A | A |
| Comparative Example 13 | 4 | — | 50 | 50 | — | A | B | B | C |
| | 5 | 30 | 70 | — | — | A | B | A | C |
| | 6 | 70 | — | — | 30 | A | B | A | B |

From the results of Examples 8 to 13 and Comparative Examples 8 to 13, it is found that a cleaning solution having flexibility and excellent cleaning capability but without adverse effect on the steps to follow can be obtained by employing a composition of the cleaning solution according to the present invention.

Examples 14 and Comparative Example 14

A 300-mm silicon wafer was coated with an anti-reflective film forming material (a product by Brewer Science, Inc., a product name "ARC29A") and, subsequently, kept in contact with the same cleaning solution as sample No. 1 of Example 8 or sample No. 4 of Comparative Example 8 for 10 seconds to perform a cleaning treatment of the edge portion of the substrate. Thereafter, the substrate was subjected to a heat treatment at 215° C. for 60 seconds to form an anti-reflective film having a film thickness of 77 nm. A resist composition for ArF excimer laser (a product by TOKYO OHKA KOGYO CO., LTD., a product name "TARF-P6111") was applied onto the anti-reflective film and, subsequently, a cleaning treatment of the edge portion of the substrate was performed by keeping the edge in contact with the same cleaning solution as sample No. 1 of Example 8 or sample No. 4 of Comparative Example 8 for 10 seconds. Thereafter, the substrate was subjected to a heat treatment at 130° C. for 90 minutes to form a resist film having a film thickness of 215 nm. Furthermore, a protective film forming material (a product by TOKYO OHKA KOGYO CO., LTD., a product name "TILC-031") was applied onto the film and, subsequently, a cleaning treatment of the edge portion of the substrate was performed by keeping the edge in contact with the same cleaning solution as sample No. 1 of Example 8 or sample No. 4 of Comparative Example 8 for 10 seconds. Thereafter, the substrate was subjected to a heat treatment at 90° C. for 60 seconds to form a protective film having a film thickness of 35 nm. By such treatments, a base material having a stack structure shown in FIG. 2 was formed.

With regard to the base materials thus treated, the edge portions of the substrates were observed from above in vertical direction by using a CCD camera (manufactured by Keyence Corporation). As the result, good cleaning capability was obtained when a cleaning solution of the present invention was used. In the contrary, when a cleaning solution of the comparative example was used, the shape of the interface of an anti-reflective film was uneven and irregularity occurred even to the interface of a protective film.

INDUSTRIAL APPLICABILITY

The cleaning solution for lithography of the present invention has flexibility that it can be applicable to all materials for forming various types of coating films to be used in a lithographic step and to all different cleaning purposes of objects. The cleaning solution for lithography of the present invention has basic properties as a cleaning solution for lithography such as cleaning capability which is ability to clean and remove an object to be cleaned efficiently in a short time, dryability which is ability to get dry quickly in a short time, and further having no adverse effect on the shape of the remaining film to be used in the step to follow. The cleaning solution for lithography of the present invention further satisfies requirements such as low cost and stable supply as well as safety of free from harmful effects on the environment and human body and of a low flash point.

What is claimed is:

1. A cleaning solution for lithography comprising an organic solvent mixture which is a combination consisting of (A) at least one kind of solvent selected from ketone organic solvents and glycol ether organic solvents, (B) at least one kind of solvent selected from lactone organic solvents and (C) at least one kind of solvent selected from alkoxybenzenes and aromatic alcohols,
   wherein the content of component (A) is from 3 to 60% by mass; the content of component (B) is from 3 to 60% by mass; and the content of component (C) is from 20 to 90% by mass;
   respectively, in the organic solvent mixture.

2. The cleaning solution for lithography according to claim 1, wherein the component (A) is at least one kind of solvent selected from ketone organic solvents.

3. The cleaning solution for lithography according to claim 2, wherein the ketone organic solvent is at least one kind of solvent selected from acetone, methyl ethyl ketone, methyl isopropyl ketone, methyl isobutyl ketone and cyclohexanone.

4. The cleaning solution for lithography according to claim 1, wherein the component (A) is at least one kind of solvent selected from glycol ether organic solvents.

5. The cleaning solution for lithography according to claim 4, wherein the glycol ether organic solvent is selected from alkyleneglycol alkyl ethers.

6. The cleaning solution for lithography according to claim 5, wherein the alkyleneglycol alkyl ether is propyleneglycol monomethyl ether.

7. The cleaning solution for lithography according to claim 1, wherein the component (B) is γ-butyrolactone.

8. The cleaning solution for lithography according to claim 1, wherein the component (C) is anisole.

9. The cleaning solution for lithography according to claim 1, which is for use in a cleaning step in manufacturing a base material by immersion lithography.

10. A method for cleaning a base material which comprises cleaning the base material by using the cleaning solution for lithography according to claim 1, in a cleaning step in manufacturing a base material by immersion lithography.

11. The method for cleaning a base material according to claim 10 wherein the cleaning step is at least one of cleaning step selected from a step of removing an unnecessary part of a coating film adhered to a back surface portion, an edge portion or both of a substrate after the coating film is formed on the base material, a step of removing an entire coating film present on a base material after the coating film is formed on the base material, and a step of cleaning a base material before a coating-film forming material is applied.

12. A method for cleaning a chemical supplying machine which comprises cleaning of the chemical supplying machine for forming a coating film by using the cleaning solution for lithography according to claim 1 in manufacturing a base material by immersion lithography.

* * * * *